United States Patent
Nomura et al.

(10) Patent No.: US 6,891,871 B1
(45) Date of Patent: May 10, 2005

(54) SEMICONDUCTOR LIGHT EMITTING DEVICE

(75) Inventors: Yasuhiko Nomura, Moriguchi (JP); Nobuhiko Hayashi, Osaka (JP); Masayuki Hata, Hirakata (JP); Masayuki Shono, Hirakata (JP)

(73) Assignee: Sanyo Electric Co., Ltd., Osaka-fu (JP)

( * ) Notice: Subject to any disclaimer, the term of this patent is extended or adjusted under 35 U.S.C. 154(b) by 0 days.

(21) Appl. No.: 09/666,553

(22) Filed: Sep. 21, 2000

(30) Foreign Application Priority Data

Sep. 24, 1999 (JP) .............................. 11-271128
Sep. 12, 2000 (JP) ........................ 2000-276205

(51) Int. Cl.[7] .................................. H01S 5/00
(52) U.S. Cl. .................................. 372/46; 372/45
(58) Field of Search ..................... 372/43–50

(56) References Cited

U.S. PATENT DOCUMENTS

| | | | | | |
|---|---|---|---|---|---|
| 5,727,008 | A | * | 3/1998 | Koga | 372/45 |
| 5,742,628 | A | * | 4/1998 | Fujii | 372/45 |
| 5,805,624 | A | * | 9/1998 | Yang et al. | 372/45 |
| 5,838,705 | A | * | 11/1998 | Shieh et al. | 372/45 |
| 5,912,913 | A | * | 6/1999 | Kondow et al. | 372/45 |
| 6,369,506 | B1 | | 4/2002 | Hata | 313/499 |

FOREIGN PATENT DOCUMENTS

| | | | |
|---|---|---|---|
| JP | 7-240535 | 9/1995 | |
| JP | 08-222808 | 8/1996 | |
| JP | 9-199787 | 7/1997 | |
| JP | 9-283843 | 10/1997 | |
| JP | 09-289358 | * 11/1997 | H01S/3/18 |
| JP | 10-189562 | 7/1998 | |
| JP | 11-126947 | 5/1999 | |
| JP | 2000-164938 | 6/2000 | |

OTHER PUBLICATIONS

Jpn. J. Appln. Phys. vol. 36 (1997) pp. L 1568–L1571 Part 2, No. 12A, Dec. 1, 1997.

* cited by examiner

Primary Examiner—Quyen Leung
(74) Attorney, Agent, or Firm—Westerman, Hattori, Daniels & Adrian, LLP

(57) ABSTRACT

An $SiN_x$ film is formed on partial side surfaces and an electrode forming surface excluding an n-side electrode of a first contact layer, the side surfaces of each layer, the upper surface of a second cladding layer and the side surfaces of a ridge portion. An $SiO_y$ film is formed on the $SiN_x$ film. The $SiN_x$ film and the $SiO_y$ film form a dielectric film.

18 Claims, 5 Drawing Sheets

SEMICONDUCTOR LIGHT EMITTING DEVICE

BACKGROUND OF THE INVENTION

1. Field of the Invention

The present invention relates to a semiconductor light emitting device having a compound semiconductor layer of a group III–V nitride-based semiconductor (hereinafter referred to as a nitride-based semiconductor) such as GaN (gallium nitride), AlN (aluminum nitride), InN (indium nitride), BN (boron nitride) or TlN (thallium nitride) or mixed crystals thereof.

2. Description of the Prior Art

In recent years, a nitride-based semiconductor laser device emitting blue or violet light is actively subjected to research and development as a recording or reproducing light source employed for an optical disk system having a high density and a high capacity.

FIG. 8 is a typical sectional view showing the structure of a conventional nitride-based semiconductor laser device. The semiconductor laser device shown in FIG. 8 is formed by successively stacking a buffer layer 2 of undoped AlGaN, an undoped GaN layer 3, a first contact layer 4 of n-GaN, a crack preventing layer 5 of n-InGaN, a first cladding layer 6 of n-AlGaN, an emission layer 7 of an InGaN multilayer film, a second cladding layer 8 of p-AlGaN and a second contact layer 9 of p-GaN on a C plane of a sapphire substrate 1 by MOCVD (metal-organic chemical vapor deposition).

Partial regions between the upper surface of the second contact layer 9 and a prescribed depth of the second cladding layer 8 are removed for forming a ridge portion 10. A partial region between the second cladding layer 8 and a prescribed depth of the first contact layer 4 is removed for forming an electrode forming surface 11.

A p-side electrode 131 is formed on the upper surface of the second contact layer 9. An n-side electrode 132 is formed on the electrode forming surface 11 of the first contact layer 4.

A dielectric film 12 of $SiO_2$ or SiN is provided for limiting a region fed with a current and obtaining optical density sufficient for lasing. The dielectric film 12 is formed on both side surfaces of the ridge portion 10, flat surface portions of the second cladding layer 8, the side surfaces of the layers from the second cladding layer 8 to the first contact layer 4 and the upper surface of the first contact layer 4.

The dielectric film 12 also has a function of preventing electrical shorting across the p-side electrode 131 and the n-side electrode 132.

When prepared from $SiO_2$, the dielectric film 12 is disadvantageously cracked or removed due to insufficient adhesion between the nitride-based semiconductor and the $SiO_2$ film. Therefore, the yield is reduced.

When the dielectric film 12 is prepared from SiN, it is difficult to form an SiN film having a thickness of several 100 nm with uniform quality since the content of N (nitrogen) strongly depends on film forming conditions. Therefore, reproducibility of device characteristics is reduced because of variation of an etching rate for forming an opening with the N content of the SiN film While influence by such dispersion of the etching rate can be reduced by reducing the thickness of the SiN film, it is difficult to completely cover a step portion in this case. If the thickness of the SiN film is reduced below 30 nm, presence of pinholes results in a reduction of voltage resistance and/or a leakage current.

SUMMARY OF THE INVENTION

An object of the present invention is to provide a semiconductor light emitting device having high reproducibility of device characteristics and an improved yield.

A semiconductor light emitting device according to an aspect of the present invention comprises a nitride-based semiconductor layer including an emission layer, and a dielectric film formed on the surface of the nitride-based semiconductor layer, and the dielectric film contains a nitride on the side of the interface between the same and the nitride-based semiconductor layer while containing an oxide on the side opposite to the nitride-based semiconductor layer.

In this semiconductor light emitting device, the nitride is in contact with the surface of the nitride-based semiconductor layer. The surface opposite to the nitride-based semiconductor layer contains the oxide. Therefore, the nitride improves adhesion between the dielectric layer and the nitride-based semiconductor layer, for preventing the dielectric film from cracking and separation. Further, the oxide uniformizes an etching rate for the dielectric film and improves the working accuracy of the dielectric film. Consequently, reproducibility of device characteristics is increased and the yield is improved.

The dielectric film may successively include a nitride film and an oxide film as the nitride and the oxide. In this case, the nitride film improves the adhesion between the dielectric film and the nitride-based semiconductor layer, and the oxide film ensures uniformity of the etching rate for the dielectric film.

The dielectric film may further include a compound film containing nitrogen and oxygen between the nitride film and the oxide film. In this case, the compound film improves the adhesion between the nitride film and the oxide film.

The compound film may have such a graded composition that the content of nitrogen gradually reduces and the content of oxygen gradually increases from the side of the interface between the same and the nitride film toward the side of the interface between the same and the oxide film. Thus, the adhesion between the nitride film and the oxide film is further improved.

The nitride film may be a silicon nitride film or a titanium nitride film, and the oxide film may be a silicon oxide film or a titanium oxide film. In this case, the aforementioned dielectric film can be readily formed.

The dielectric film may include a compound film containing nitrogen and oxygen as the nitride and the oxide, and the compound film may have such a graded composition that the content of nitrogen gradually reduces and the content of oxygen gradually increases from the side of the interface between the same and the nitride-based semiconductor layer toward the opposite side.

In this case, a region of the compound film having a large content of nitrogen improves the adhesion between the nitride-based semiconductor layer and the dielectric film, and a region of the compound film having a large content of oxygen ensures uniformity of the etching rate for the dielectric film.

The compound film may be a compound film containing silicon or titanium and containing nitrogen and oxygen. In this case, the compound film can be readily formed.

A semiconductor light emitting device according to another aspect of the present invention comprises a nitride-based semiconductor layer including an emission layer and a dielectric film formed on the surface of the nitride-based semiconductor layer, and the dielectric film contains a compound containing nitrogen and oxygen on the side of the interface between the same and the nitride-based semiconductor layer while containing an oxide on the side opposite to the nitride-based semiconductor layer.

In this semiconductor light emitting device, the compound containing nitrogen and oxygen is in contact with the surface of the nitride-based semiconductor layer, The surface opposite to the nitride-based semiconductor layer contains the oxide. Therefore, the compound improves the adhesion between the dielectric film and the nitride-based semiconductor layer, for preventing the dielectric film from cracking and separation. Further, the oxide uniformizes an etching rate for the dielectric film, and improves working accuracy of the dielectric film. Consequently, reproducibility of device characteristics is increased and the yield is improved.

The dielectric film may include a compound film as the compound and may include an oxide film as the oxide, while the compound film may have such a graded composition that the content of nitrogen gradually reduces and the content of oxygen gradually increases from the side of the interface between the same and the nitride-based semiconductor layer toward the opposite side.

In this case, a region of the compound film having a large content of nitrogen improves the adhesion between the nitride-based semiconductor layer and the dielectric film, and the oxide film ensures uniformity of the etching rate for the dielectric film.

The compound film may be a compound film containing silicon or titanium and containing nitrogen and oxygen, and the oxide film may be a silicon oxide film or a titanium oxide film. In this case, the compound film and the oxide film can be readily formed.

A semiconductor light emitting device according to still another aspect of the present invention comprises a nitride-based semiconductor layer including an emission layer and a dielectric film formed on the surface of the nitride-based semiconductor layer, and the dielectric film contains a nitride on the side of the interface between the same and the nitride-based semiconductor layer while containing a compound containing nitrogen and oxygen on the side opposite to the nitride-based semiconductor layer.

In this semiconductor light emitting device, the nitride is in contact with the surface of the nitride-based semiconductor layer. The surface opposite to the nitride-based semiconductor layer contains the compound containing nitrogen and oxygen. Therefore, the nitride improves the adhesion between the dielectric film and the nitride-based semiconductor layer, and prevents the dielectric film from cracking and removing. Further, the compound uniformizes an etching rate for the dielectric film, and improves working accuracy of the dielectric film. Consequently, reproducibility of device characteristics is increased and the yield is improved.

The dielectric film may include a nitride film as the nitride and may include a compound film as the compound, while the compound film may have such a graded composition that the content of nitrogen gradually reduces and the content of oxygen gradually increases from the side of the interface between the same and the nitride film toward the opposite side.

In this case, the nitride film improves the adhesion between the dielectric film and the nitride-based semiconductor layer, and a region of the compound film having a large content of oxygen ensures uniformity of the etching rate for the dielectric film.

The nitride film may be a silicon nitride film or a titanium nitride film, and the compound film may be a compound film containing silicon or titanium and containing nitrogen and oxygen. In this case, the nitride film and the compound film can be readily formed.

The nitride-based semiconductor layer may further include a cladding layer formed on the emission layer, the cladding layer may have a flat portion and a ridge portion located on the flat portion, and the dielectric film may be formed on the flat portion of the cladding layer and the side surface of the ridge portion.

In this case, the operating current of a semiconductor laser device serving as the semiconductor light emitting device can be reduced and the yield can be improved.

The side surface of the ridge portion may be irregularized, and the dielectric film may be formed on the flat portion of the cladding layer and the side surface of the ridge portion.

In this case, the irregular side surface of the ridge portion further improves the adhesion between the dielectric film and the nitride-based semiconductor layer. Therefore, the dielectric film is sufficiently prevented from cracking or removing, and an unavailable current is further reduced.

The nitride-based semiconductor layer may further include a first conductivity type semiconductor layer provided under the emission layer and a second conductivity type semiconductor layer provided on the emission layer, a partial region of the nitride-based semiconductor layer may be removed to partially expose the first conductivity type semiconductor layer, a first electrode may be formed on the exposed region of the first conductivity type semiconductor layer, a second electrode may be formed on the second conductivity type semiconductor layer, and the dielectric film may be formed on the surface of the nitride-based semiconductor layer between the first electrode and the second electrode.

In this case, the first and second electrodes of the semiconductor light emitting device can be reliably isolated from each other, and the yield can be improved.

A semiconductor light emitting device according to a further aspect of the present invention comprises an emission layer composed of a nitride-based semiconductor, a cladding layer formed on the emission layer and composed of a nitride-based semiconductor having a flat portion and a ridge portion located on the flat portion, the side surface of the ridge portion of the cladding layer being irregularized, and a dielectric film formed on the flat portion of the cladding layer and the side surface of the ridge portion.

In the semiconductor light emitting device, the irregularized side surface of the ridge portion improves the adhesion between the dielectric film and the nitride-based semiconductor. Therefore, the dielectric film is prevented from cracking or removing, and an unavailable current is reduced.

The dielectric film may contain a nitride on the side of the interface between the same and the nitride-based semiconductor layer, and may contain an oxide on the side opposite to the nitride-based semiconductor layer. In this case, the nitride further improves the adhesion between the dielectric film and the nitride-based semiconductor layer, and the oxide ensures uniformity of an etching rate for the dielectric film. Consequently, reproducibility of device characteristics is increased and the yield is further improved.

The dielectric film may contain a compound containing nitrogen and oxygen on the side of the interface between the same and the nitride-based semiconductor layer, and may contain an oxide on the side opposite to the nitride-based semiconductor layer. In this case, the compound further improves the adhesion between the dielectric film and the nitride-based semiconductor layer, and the oxide ensures uniformity of the etching rate for the dielectric film. Consequently, reproducibility of device characteristics is increased and the yield is further improved.

The dielectric film may contain a nitride on the side of the interface between the same and the nitride-based semiconductor layer, and may contain a compound containing nitrogen and oxygen on the side opposite to the nitride-based semiconductor layer. In this case, the nitride further improves the adhesion between the dielectric film and the nitride-based semiconductor layer, and the compound ensures uniformity of the etching rate for the dielectric film. Consequently, reproducibility of device characteristics is increased and the yield is further improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
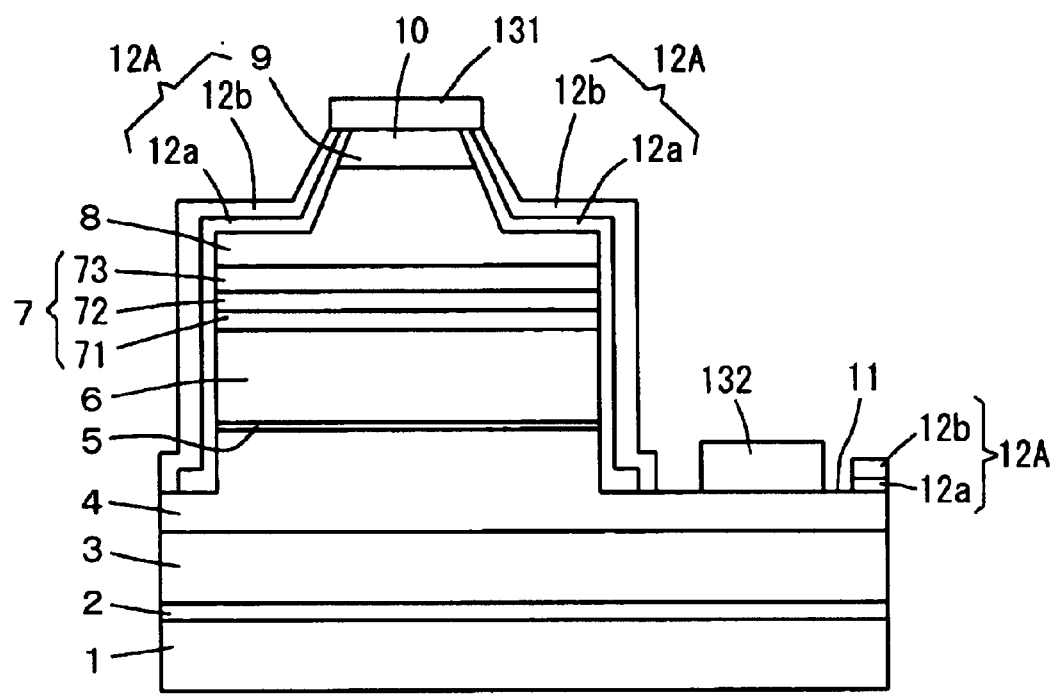
FIG. 1 is a typical sectional view showing the structure of a semiconductor laser device according to a first embodiment of the present invention.

FIG. 1 is a typical sectional view showing the structure of a nitride-based semiconductor laser device according to a first embodiment of the present invention.

The semiconductor laser device shown in FIG. 1 is a ridge guided semiconductor laser device. The semiconductor laser device shown in FIG. 1 is formed by successively stacking a buffer layer 2 of undoped $Al_{0.5}Ga_{0.5}N$, a GaN layer 3 of undoped GaN, a first contact layer 4 of n-GaN, a crack preventing layer 5 of n-$In_{0.1}Ga_{0.9}N$, a first cladding layer 6 of n-$Al_{0.07}Ga_{0.93}N$, an emission layer 7 having a multiple quantum well structure described later, a second cladding layer 8 of p-$Al_{0.07}Ga_{0.93}N$ and a second contact layer 9 of p-GaN on a C plane of a sapphire substrate 1 by MOCVD.

The semiconductor laser device is doped with Si for attaining n-type conductivity, and doped with Mg for attaining p-type conductivity.

Partial regions between the upper surface of the second contact layer 9 and a prescribed depth of the second cladding layer 8 are removed by reactive ion etching or reactive ion beam etching, for forming a striped ridge portion 10. A partial region between the upper surface of the second cladding layer 8 and a prescribed depth of the first contact layer 4 is removed by reactive ion etching or reactive ion beam etching, for forming an electrode forming surface 11 of the first contact layer 4.

An $SiN_x$ film 12a (x is approximately 1) is formed on both side surfaces of the ridge portion 10, flat surface portions and the side surfaces of the second cladding layer 8, the side surfaces of the emission layer 7, the side surfaces of the first cladding layer 6, the side surfaces of the crack preventing layer 5, partial side surfaces of the first contact layer 4 and the electrode forming surface 11 excluding a region formed with an n-side electrode 132. An $SiO_y$ film 12b (y is approximately 2) is formed on the $SiN_x$ film 12a. The $SiN_x$ film 12a and the $SiO_y$ film 12b form a dielectric film 12A.

A p-side electrode 131 is formed on the upper surface of the second contact layer 9, and the n-side electrode 132 is formed on the electrode forming surface 11 of the first contact layer 4.

Figure 2:
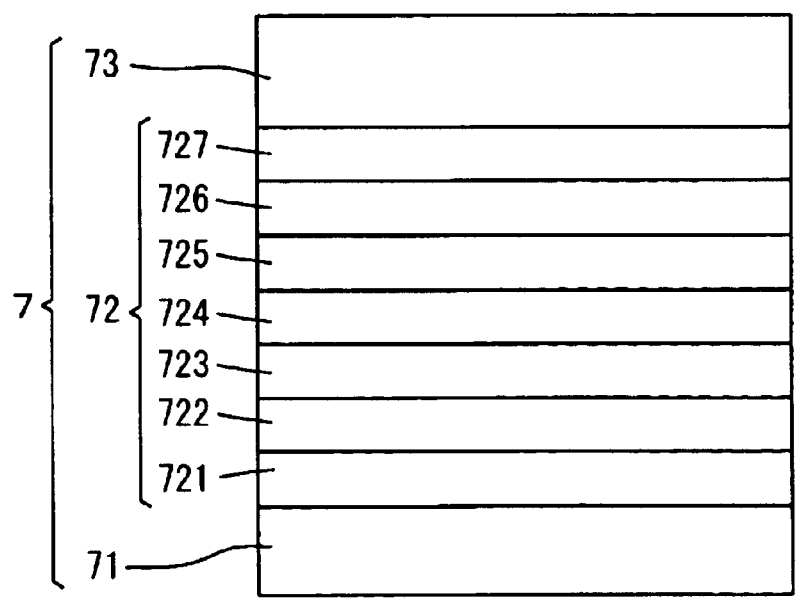
FIG. 2 is a typical sectional view showing the structure of an active layer of the semiconductor laser device shown in FIG. 1.

FIG. 2 is a typical sectional view showing the multiple quantum well structure of the emission layer 7. The emission layer 7 includes a first light guide layer 71 of n-GaN formed on the first cladding layer 6, an active layer 72 formed on the first light guide layer 71 and a second light guide layer 73 of p-GaN formed on the active layer 72. The active layer 72 is formed by alternately stacking barrier layers 721, 723, 725 and 727 of n-$In_{0.02}Ga_{0.98}N$ and well layers 722, 724 and 726 of n-$In_{0.10}Ga_{0.90}N$.

In the semiconductor laser device shown in FIG. 1. the $SiO_y$ film 12b ensures reproducibility of an etching rate, thereby increasing working accuracy of the dielectric film 12A. Further, the $SiN_x$ film 12a improves adhesion between the dielectric film 12A and the layers 4 to 9. Thus, the dielectric film 12A is hardly cracked and a leakage current is reduced. Consequently, the semiconductor light emitting device shown in FIG. 1 is reduced in operating current and improved in manufacturing yield.

(Second Embodiment)

Figure 3:
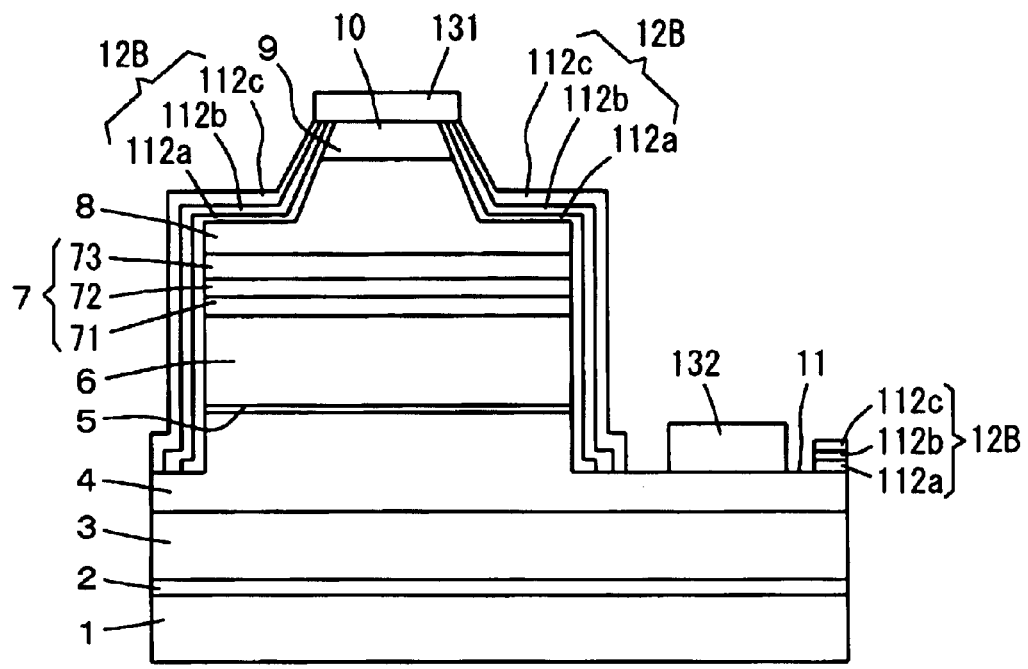
FIG. 3 is a typical sectional view showing the structure of a semiconductor laser device according to a second embodiment of the present invention.

FIG. 3 is a typical sectional view showing the structure of a nitride-based semiconductor laser device according to a second embodiment of the present invention. The structure of the nitride-based semiconductor laser device according to the second embodiment shown in FIG. 3 is similar to the structure of the nitride-based semiconductor laser device according to the first embodiment shown in FIG. 1 except a dielectric film.

The nitride-based semiconductor laser device shown in FIG. 3 comprises a dielectric film 12B in place of the dielectric film 12A of the nitride-based semiconductor laser device shown in FIG. 1.

The dielectric film 12B is formed by an $SiN_x$ film 112a (x is approximately 1), an $SiN_{x1}O_{y1}$ film 112b (x1 is approximately 0.5 and y1 is approximately 1) and an $SiO_y$ film 112c (y is approximately 2).

The $SiN_x$ film 112a is formed on both side surfaces of a ridge portion 10, flat surface portions and the side surfaces of a second cladding layer 8, the side surfaces of an emission layer 7, the side surfaces of a first cladding layer 6, the side surfaces of a crack preventing layer 4, partial side surfaces of a first contact layer 4 and an electrode forming surface 11 excluding a region formed with an n-side electrode 132. The $SiN_{x1}O_{y1}$ film 112b (x1 is approximately 0.5 and y1 is approximately 1) is formed on the $SiN_x$ film 112a, and the $SiO_y$ film 112c (y is approximately 2) is formed on the $SiN_{x1}O_{y1}$ film 112b.

Thus, the $SiN_{x1}O_{y1}$ film 112b containing nitrogen and oxygen is formed between the $SiN_x$ film 112a and the $SiO_y$ film 112c, thereby further improving adhesion between the $SiN_x$ film 112a and the $SiO_y$ film 112c, further suppressing the dielectric film 12B from removing and improving the yield. Further, the dielectric film 12B is so hardly cracked that a leakage current as well as an operating current are reduced. In addition, reproducibility of an etching rate for the dielectric film 12B is improved, for enabling manufacturing of a nitride-based semiconductor laser device with small dispersion between lots.

(Third Embodiment)

Figure 4:
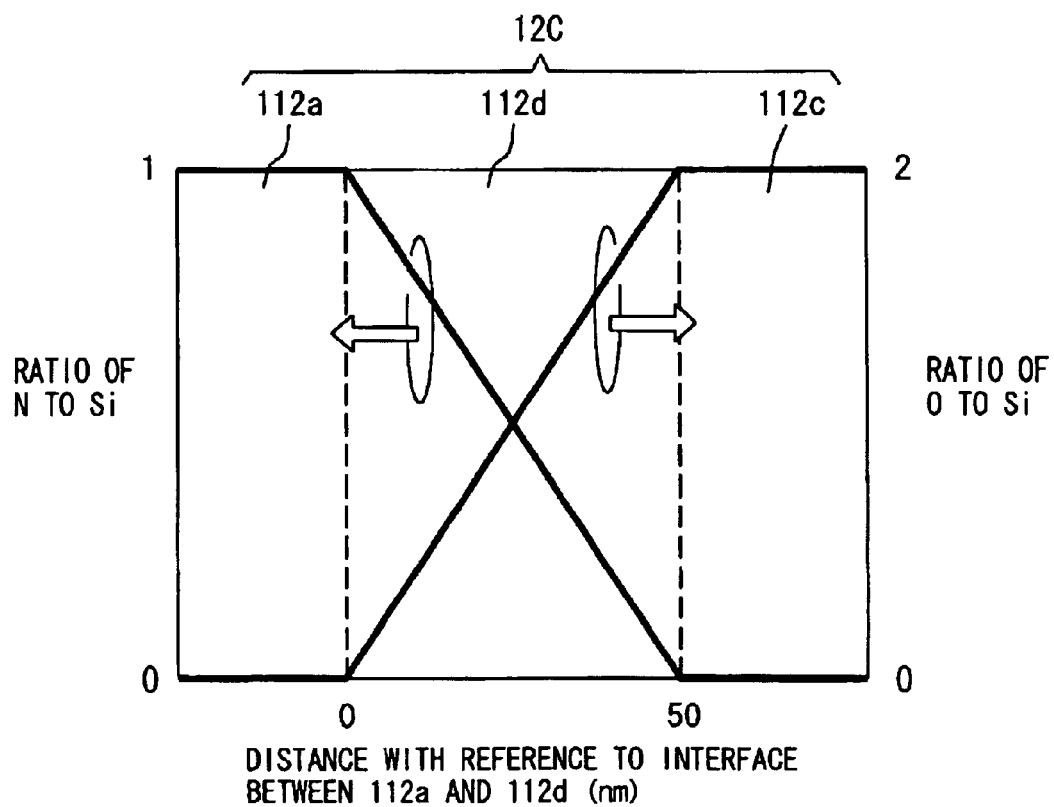
FIG. 4 is a diagram for illustrating the structure of a dielectric film of a semiconductor laser device according to a third embodiment of the present invention.

FIG. 4 is a diagram for illustrating the structure of a dielectric film of a nitride-based semiconductor laser device according to a third embodiment of the present invention.

The structure of the nitride-based semiconductor laser device according to the third embodiment is similar to the structure of the nitride-based semiconductor laser device shown in FIG. 1 except a dielectric film.

The nitride-based semiconductor laser device according to the third embodiment comprises a dielectric film 12C shown in FIG. 4 in place of the dielectric film 12A of the nitride-based semiconductor laser device shown in FIG. 1.

The dielectric film 12C successively includes an $SiN_x$ film 112a, an $SiN_{x2}O_{y2}$ film 112d and an $SiO_y$ film 112c.

The $SiN_x$ film 112a is formed on both side surfaces of the ridge portion 10, the flat surface portions and the side surfaces of the second cladding layer 8, the side surfaces of the emission layer 7, the side surfaces of the first cladding layer 6, the side surfaces of the crack preventing layer 5, partial side surfaces of the first contact layer 4 and the electrode forming surface 11 excluding the region formed with the n-side electrode 132 shown in FIG. 1.

In the $SiN_{x2}O_{y2}$ film 112d, the content x2 of N (nitrogen) gradually reduces from 1 to zero and the content y2 of O (oxygen) gradually increases from zero to 2 from the interface between the $SiN_{x2}O_{y2}$ film 112d and the $SiN_x$ film 112a, as shown in FIG. 4.

Thus, the $SiN_{x2}O_{y2}$ film 112d having gradually changing contents of N and O is formed between the $SiN_x$ film 112a and the $SiO_y$ film 112c formed on a nitride-based semiconductor, thereby further increasing adhesion between the $SiN_x$ film 112a and the $SiO_y$ film 112c, further suppressing removing of the dielectric film 12C and improving the yield. Further, the dielectric film 12C is so hardly cracked that a leakage current as well as an operating current are reduced. In addition, reproducibility of an etching rate for the dielectric film 12C is improved, to enable manufacturing of a nitride-based semiconductor laser device with small dispersion between lots.

(Fourth Embodiment)

Figure 5:
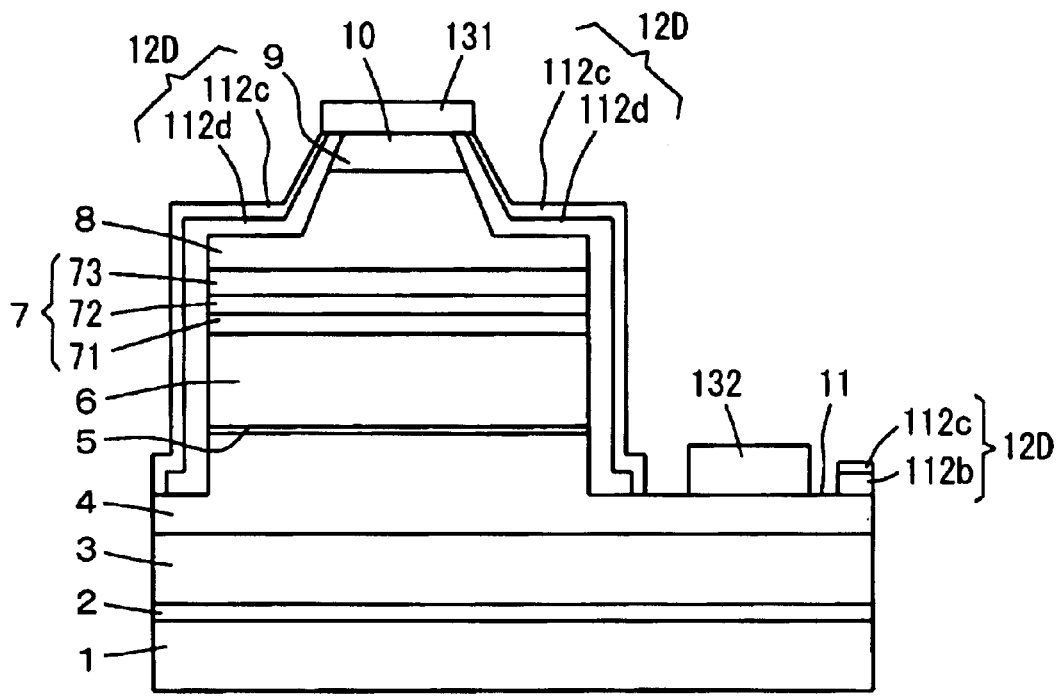
FIG. 5 is a typical sectional view showing the structure of a semiconductor laser device according to a fourth embodiment of the present invention.

FIG. 5 is a typical sectional view showing the structure of a nitride-based semiconductor laser device according to a fourth embodiment of the present invention.

The structure of the nitride-based semiconductor laser device shown in FIG. 5 is similar to the structure of the nitride-based semiconductor laser device shown in FIG. 1 except a dielectric film.

The nitride-based semiconductor laser device shown in FIG. 5 comprises a dielectric film 12D in place of the dielectric film 12A of the nitride-based semiconductor laser device shown in FIG. 1.

The dielectric film 12D is formed by an $SiN_{x2}O_{y2}$ film 112d and an $SiO_y$ film 112c.

Thus, the $SiN_{x2}O_{y2}$ film 112d having gradually changing contents of N and O is formed between a nitride-based semiconductor and the $SiO_y$ film 112c, thereby further increasing adhesion between the nitride-based semiconductor and the dielectric film 12D, further suppressing removing of the dielectric film 12D and improving the yield. Further, the dielectric film 12D is so hardly cracked that a leakage current as well as an operating current are reduced. In addition, reproducibility of an etching rate for the dielectric film 12D is improved, to enable manufacturing of a nitride-based semiconductor laser device with small dispersion between lots.

(Fifth Embodiment)

A nitride-based semiconductor laser device according to a fifth embodiment of the present invention is now described.

In the structure of the nitride-based semiconductor laser device according to the fifth embodiment, the $SiN_x$ film 12a is replaced with a $TiN_x$ film (x is approximately 1) and the $SiO_y$ film 12b is replaced with a $TiO_y$ film (y is approximately 2) in the structure of the nitride-based semiconductor laser device shown in FIG. 1.

Also when employing $TiN_x$ and $TiO_y$ for the nitride film and the oxide film respectively, adhesion between a nitride-based semiconductor and a dielectric film is improved, removing of the dielectric film is suppressed, and the yield is improved. Further, the dielectric film is so hardly cracked that a leakage current as well as an operating current are reduced. In addition, reproducibility of an etching rate for the dielectric film is improved, to enable manufacturing of a nitride-based semiconductor laser device with small dispersion between lots.

While the dielectric film 12A of the silicon compound in the semiconductor laser device shown in FIG. 1 is replaced with the dielectric film of the titanium compound in the fifth embodiment, the dielectric films 12B to 12D of silicon compounds may be replaced with dielectric films of titanium compounds in the semiconductor laser devices according to the second to fourth embodiments shown in FIGS. 3 to 5.

In a dielectric film formed by replacing Si with Ti in the dielectric film 12B to include a $TiN_x$ film, a $TiN_{x1}O_{y1}$ film and a $TiO_y$ film, adhesion between the $TiN_x$ film and the $TiO_y$ film is further improved. In a dielectric film formed by replacing Si with Ti in the dielectric film 12C to include a $TiN_x$ film, a $TiN_{x2}O_{y2}$ film and a $TiO_y$ film, adhesion between the $TiN_x$ film and the $TiO_y$ film is further improved. In a dielectric film formed by replacing Si with Ti in the dielectric film 12D to include a $TiN_{x2}O_{y2}$ film and a $TiO_y$ film, further, adhesion between a nitride-based semiconductor formed under the $TiN_{x2}O_{y2}$ film and the $TiO_y$ film is further improved.

(Sixth Embodiment)

Figure 6:
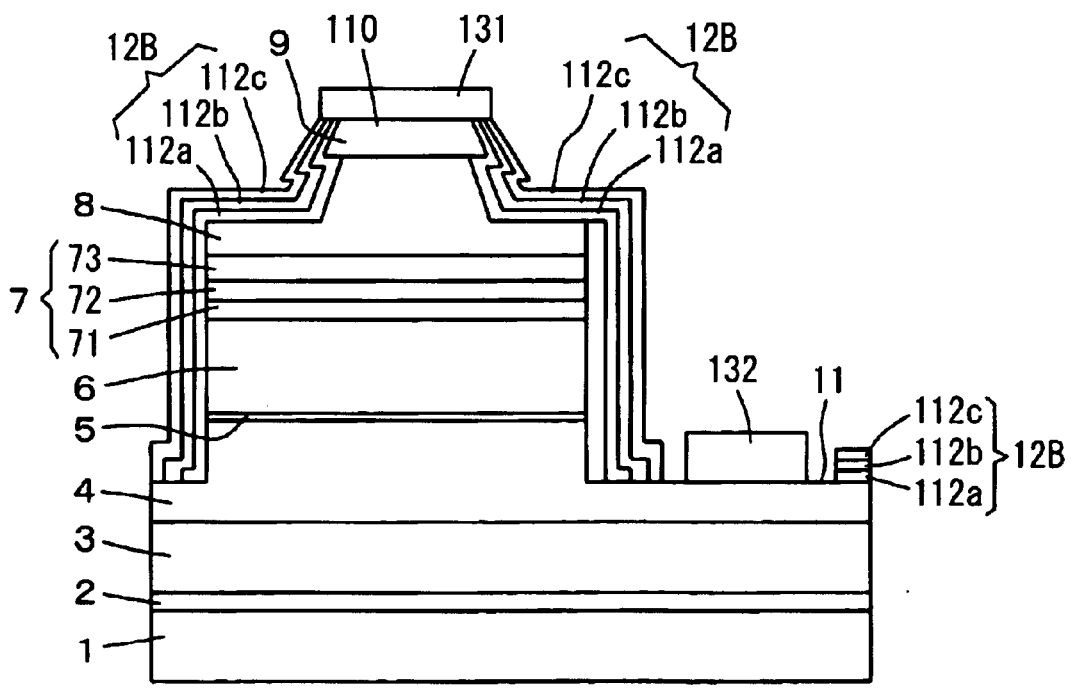
FIG. 6 is a typical sectional view showing the structure of a semiconductor laser device according to a sixth embodiment of the present invention.

FIG. 6 is a typical sectional view showing the structure of a nitride-based semiconductor laser device according to a sixth embodiment of the present invention.

The nitride-based semiconductor laser device shown in FIG. 6 has irregularities of 2 to 10 nm on the side surfaces of a ridge portion 110. The structure of the nitride-based semiconductor laser device shown in FIG. 6 is similar to the structure of the nitride-based semiconductor laser device according to the second embodiment shown in FIG. 3 except the irregularities on the side surfaces of the ridge portion 110.

In order to form the ridge portion 110, regions between the upper surface of a second contact layer 9 and an intermediate portion of a second cladding layer 8 are etched through a mask of Ni by dry etching such as reactive ion etching (RIE) or reactive ion beam etching (RIBE) thereby forming convex portions. Thereafter a chemical etching property is improved by reducing a high-frequency output of RIE, for example, so that damage layers can be removed from the side walls of the convex portions. Thus, the transverse etching rate is varied on the side walls due to different crystallinity of GaN (second contact layer 9) and AlGaN (second cladding layer 8), to form steps. Thus, the ridge portion 110 having irregular side surfaces is formed. The damage layers may alternatively be removed from the side walls of the ridge portion 110 by alkaline wet etching in place of reducing the high-frequency output power of RIE, to attain the same result.

The side surfaces of the ridge portion 110 are so irregularized as to further improve adhesion between a dielectric film 12B, the second cladding layer 8 and the second contact layer 9. Thus, the dielectric film 12B is prevented from cracking or removing, and a leakage current is reduced.

While the nitride-based semiconductor laser device shown in FIG. 6 has the dielectric film 12B identical to that of the semiconductor laser device shown in FIG. 3, this dielectric film 12B may be replaced with the dielectric film 12A shown in FIG. 1, the dielectric film 12C shown in FIG. 4 or the dielectric film 12D shown in FIG. 5. The adhesion, improved by the irregular side surfaces of the ridge portion 110 regardless of the structure of the dielectric film, is further improved due to the effect by the dielectric film 12A, 12B, 12C or 12D.

(Seventh Embodiment)

Figure 7:
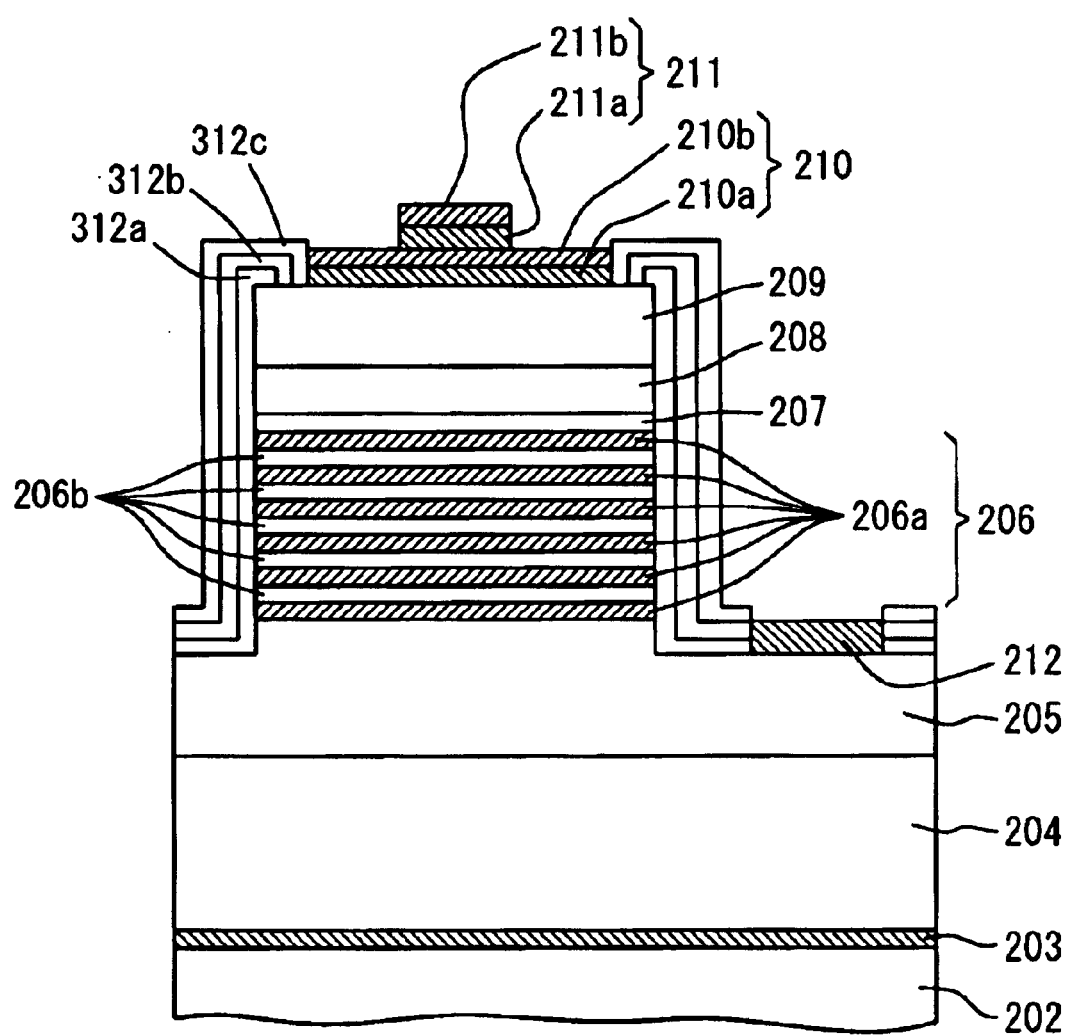
FIG. 7 is a typical sectional view showing the structure of a light emitting diode according to a seventh embodiment of the present invention.
Figure 8:
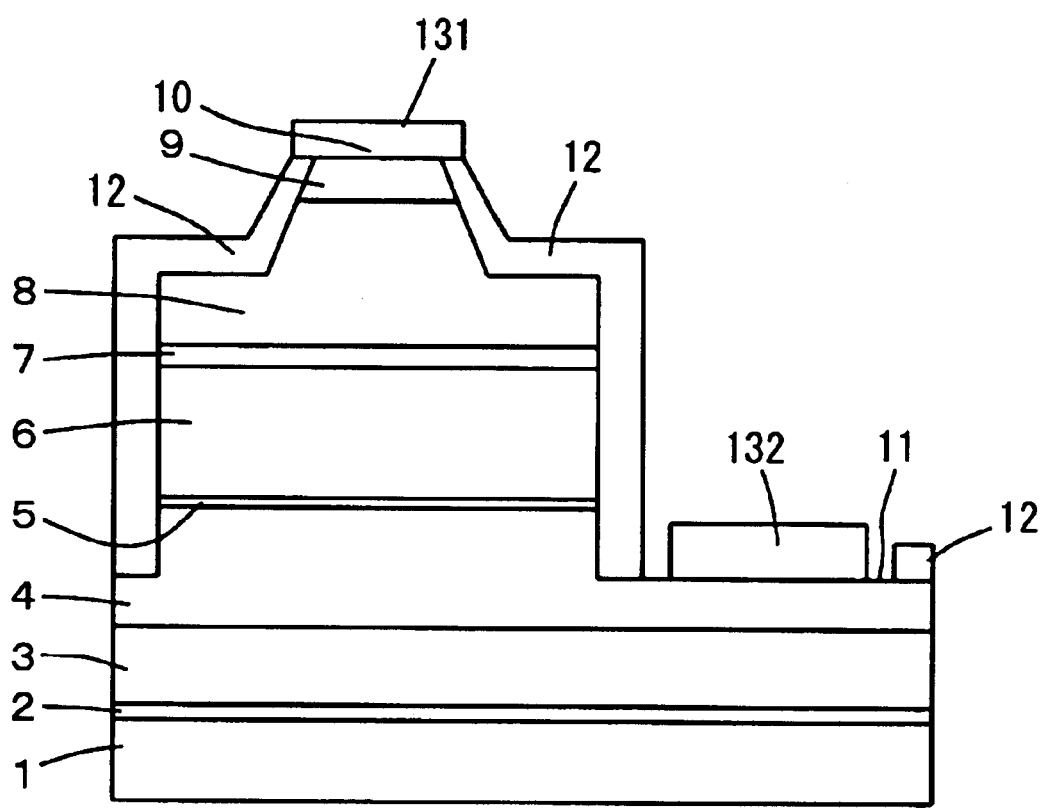
FIG. 8 is a typical sectional view showing the structure of a conventional semiconductor laser device.

FIG. 7 is a typical sectional view showing the structure of a light emitting diode according to a seventh embodiment of the present invention.

In the light emitting diode shown in FIG. 7, an AlGaN low-temperature buffer layer 203 of undoped AlGaN having a thickness of 20 nm, an undoped GaN high-temperature buffer layer 204 having a thickness of 400 nm, an n-GaN contact layer 205 having a thickness of 1.5 μm, an MQW (multiple quantum well) active layer (emission layer) 206, an undoped GaN protective layer 207 having a thickness of 10 nm, a p-$Al_{0.05}Ga_{0.95}N$ cladding layer 208 having a thickness of 150 nm and a p-GaN contact layer 209 having a thickness of 300 nm are successively formed on a sapphire substrate 202. In this case, Si is employed as an n-type dopant, and Mg is employed as a p-type dopant.

The MQW active layer 206 has a multiple quantum well structure formed by stacking six barrier layers 206a of undoped GaN each having a thickness of 5 nm and five well layers 206b of undoped $In_{0.35}Ga_{0.65}N$ each having a thickness of 5 nm. The undoped GaN protective layer 207 is formed on the MQW active layer 206 for preventing the MQW active layer 206 from crystal deterioration.

A partial region between the p-GaN contact layer 209 and the n-GaN contact layer 205 is removed by etching, so that an n-side electrode 212 of Al having a thickness of 500 nm is formed on the upper surface of a prescribed region of the exposed n-GaN contact layer 205. A p-side translucent electrode 210 is formed on the upper surface of a prescribed region of the p-GaN contact layer 209 by stacking an Ni film 210a having a thickness of 2 nm and an Au film 210b having a thickness of 4 nm, and a p-side pad electrode 211 is formed thereon by stacking a Ti film 211a having a thickness of 30 nm and an Au film 211b having a thickness of 500 nm.

The light emitting diode shown in FIG. 7 is manufactured as follows:

In order to manufacture the light emitting diode, a sapphire substrate 202 having a surface formed by a C plane is arranged in an MOCVD apparatus, for successively growing the AlGaN low-temperature buffer layer 203, the undoped GaN high-temperature buffer layer 204, the n-GaN contact layer 205, the MQW active layer 206, the undoped GaN protective layer 207, the p-$Al_{0.05}Ga_{0.95}N$ cladding layer 208 and the p-GaN contact layer 209 on the C plane of the sapphire substrate 202 by MOCVD. Table 1 shows the thicknesses and growth conditions of the layers 203 to 209.

TABLE 1

| | Thickness (nm) | Substrate Temperature as Growth | Material Gas | Carrier Gas |
|---|---|---|---|---|
| Low-Temperature Buffer Layer of AlGaN | 20 | 600 | $NH_3$, TMAl TMGa | $H_2$, $N_2$ |
| High-Temperature Buffer Layer of Undoped GaN | 400 | 1150 | $NH_3$, TMGa | $H_2$, $N_2$ |
| Contact Layer of n-GaN | 1500 | 1150 | $NH_3$, TMGa $SiH_4$ | $H_2$, $N_2$ |
| MQW Active Layer Barrier Layer of Undoped GaN (6 Layers) | 5 (each) | 850 | $NH_3$, TEGa | $H_2$, $N_2$ |
| Well Layer of Undoped $In_{0.35}Ga_{0.65}N$ (5 Layers) | 5 (each) | | $NH_3$, TEGa TMIn | |
| Protective Layer of Undoped GaN | 10 | 850 | $NH_3$, TEGa | $H_2$, $N_2$ |
| Cladding Layer of p-$Al_{0.05}Ga_{0.95}N$ | 150 | 1150 | $NH_3$, TMGa TMAl, $Cp_2Mg$ | $H_2$, $N_2$ |
| Contact Layer of p-GaN | 300 | 1150 | $NH_3$, TMGa $Cp_2Mg$ | $H_2$, $N_2$ |

Referring to Table 1, TMAl stands for trimethyl aluminum, TMGa stands for trimethyl gallium, TMIn stands for trimethyl indium, and TEGa stands for triethyl gallium. Referring to reactive gas, $NH_3$ is a nitrogen source, TMAl is an aluminum source, TMGa and TEGa are gallium sources, and TMIn is an indium source. $SiH_4$ (silane gas) is an n-type doping material, and $Cp_2Mg$ (bis(cyclopentadienyl) magnesium) is a p-type doping material.

The substrate temperatures as growth of the layers 203 to 209 are not restricted to those described in Table 1. The substrate temperature may be set to a non-single-crystalline growth temperature when growing the AlGaN low-temperature buffer layer 203, and may be set to a single-crystalline growth temperature when growing each of the layers 204 to 209. In particular, the substrate temperature is preferably set to 1000 to 1200° C. when growing each of the layers 204, 205, 208 and 209. Further, the substrate temperature is preferably set to 700 to 1000° C. when growing each of the layers 206 and 207.

In the carrier gas containing $H_2$ and $N_2$ supplied for growing each of the layers 203 to 209, the content of $H_2$ is 50% when growing the layers 203 to 205, 1 to 5% when growing the layers 206 and 207, and 1 to 3% when growing the layers 207 to 209.

INVENTIVE EXAMPLES

Inventive Example 1

In Inventive Example 1, the semiconductor laser device shown in FIG. 1 was employed.

The semiconductor laser device shown in FIG. 1 was prepared as follows: A buffer layer 2 of $Al_{0.5}Ga_{0.5}N$ having a thickness of 250 Å, a GaN layer 3 of undoped GaN having a thickness of 2 μm, a first contact layer 4 of n-GaN having a thickness of 3 μm, a crack preventing layer 5 of n-$In_{0.1}Ga_{0.9}N$ having a thickness of 0.1 μm, a first cladding layer 6 of n-$Al_{0.07}Ga_{0.93}N$ having a thickness of 1 μm, an emission layer 7, a second cladding layer 8 of p-$Al_{0.07}Ga_{0.93}N$ having a thickness of 0.3 μm and a second contact layer 9 of p-GaN having a thickness of 0.05 μm were successively grown on a C plane of a sapphire substrate 1 by MOCVD (metal-organic chemical vapor deposition). As to the emission layer 7 having a multiple quantum well structure, a first light guide layer 71 of n-GaN having a thickness of 0.1 μm formed on the first cladding layer 6, an active layer 72 described later and a second light guide layer 73 of p-GaN having a thickness of 0.1 μm were successively stacked. Four barrier layers 721, 723, 725 and 727 of n-$In_{0.02}Ga_{0.98}N$ each having a thickness of 6 nm and three well layers 722, 724 and 726 of n-$In_{0.10}Ga_{0.90}N$ each having a thickness of 3 nm were alternately stacked as the active layer 72.

A dielectric film 12A was formed by plasma CVD with source materials of $SiH_4$ (100%), $NH_3$ (100%) and $N_2O$ (100%). An $SiN_x$ film 12a having a thickness of 50 nm was formed under conditions of an $SiH_4$ flow rate of 15 SCCM (standard cubic centimeter per minute), an $NH_3$ flow rate of 200 SCCM, a high-frequency output of 200 W and a substrate temperature of 300° C. An $SiO_y$ film 12b having a thickness of 500 nm was formed under conditions of an $SiH_4$ flow rate of 10 SCCM, an $N_2O$ flow rate of 100 SCCM, a high-frequency output of 200 W and a substrate temperature of 300° C. The $SiN_x$ film 12a and the $SiO_y$ film 12b were formed in the same apparatus.

In the semiconductor laser device according to Inventive Example 1, the mean operating current of 10 lots with an output power of 5 mW was 72 mA, and the yield was 85%.

Inventive Example 2

In Inventive Example 2, the semiconductor laser device shown in FIG. 3 was employed.

The semiconductor laser device shown in FIG. 3 was prepared similarly to the semiconductor laser device according to Inventive Example 1, except the dielectric film 12B.

The thickness of the $SiN_x$ film 112a was 50 nm, the thickness of the $SiN_{x1}O_{y1}$ film 112b was 50 nm, and the thickness of the $SiO_y$ film 112c was 500 nm.

The $SiN_x$ film 112a was formed under the same conditions as the $SiN_x$ film 12a, and the $SiO_y$ film 112c was formed under the same conditions as the $SiO_y$ film 12b. The film forming conditions for the $SiN_{x1}O_{y1}$ film 112b were set to an $SiH_4$ flow rate of 30 SCCM, an $NH_3$ flow rate of 200 SCCM, an $N_2O$ flow rate of 150 SCCM, a high-frequency output of 200 W and a substrate temperature of 300° C. The $SiN_x$ film 112a, the $SiN_{x1}O_{y1}$ film 112b and the $SiO_y$ film 112c were formed in the same apparatus.

In the semiconductor laser device according to Inventive Example 2, the mean operating current of 10 lots with an output power of 5 mW was 72 mA, and the yield was 87%.

Inventive Example 3

In Inventive Example 3, the semiconductor laser device including the dielectric film 12C having the structure shown in FIG. 4 was employed.

The semiconductor laser device shown in FIG. 4 was formed similarly to the semiconductor laser device according to Inventive Example 2, except the $SiN_{x2}O_{y2}$ film 112d of the dielectric film 12C.

The thickness of the $SiN_{x2}O_{y2}$ film 112d shown in FIG. 4 was 50 nm. The $SiN_{x2}O_{y2}$ film 112d was formed by plasma CVD with a high-frequency output of 200 W, a substrate temperature of 300° C. and a constant $SiH_4$ flow rate of 30 SCCM while gradually reducing an $NH_3$ flow rate from 200 SCCM to 0 SCCM and gradually increasing an $N_2O$ flow rate from 0 SCCM to 150 SCCM.

In the semiconductor laser device according to Inventive Example 3, the mean operating current of 10 lots with an output power of 5 mW was 69 mA, and the yield was 90%.

Inventive Example 4

In Inventive Example 4, the semiconductor laser device shown in FIG. 5 was employed.

The semiconductor laser device shown in FIG. 5 was formed similarly to the semiconductor laser device shown in FIG. 4, except that no $SiN_x$ film 112a was formed.

The $SiN_{x2}O_{y2}$ film 112d was formed by plasma CVD with a high-frequency output of 200 W, a substrate temperature of 300° C. and a constant $SiH_4$ flow rate of 30 SCCM while gradually reducing an $NH_3$ flow rate from 200 SCCM to 0 SCCM and gradually Increasing an $N_2O$ flow rate from 0 SCCM to 150 SCCM.

In the semiconductor laser device according to Inventive Example 4, the mean operating current of 10 lots with an output power of 5 mW was 70 mA, and the yield was 88%.

Inventive Example 5

In Inventive Example 5, the semiconductor laser device shown in FIG. 5 was employed.

An $SiO_y$ film 112c (y is approximately 2) having a thickness of 500 nm was formed on a nitride-based semiconductor layer under the conditions of Inventive Example 2. Thereafter the sample was kept at 1000° C. in an $N_2$ atmosphere and heat-treated for 30 minutes, thereby forming an $SiN_{x2}O_{y2}$ film 112d having a thickness of 10 nm on the interface between the nitride-based semiconductor and $SiO_y$.

In the semiconductor laser device according to Inventive Example 5, the mean operating current of 10 lots with an output power of 5 mW was 70 mA. and the yield was 87%.

Inventive Example 6

In Inventive Example 6, a striped ridge portion 10 removed up to a prescribed depth of a second cladding layer 8 was formed by reactive ion etching or reactive ion beam etching. At this time, irregularities of 2 to 10 nm were formed on the side surfaces of the ridge portion 10. Thereafter a semiconductor laser device was prepared similarly to Inventive Examples 1 to 5.

In this case, the mean operating current was reduced by about 5%, and the yield was improved by 2 to 3%.

Inventive Example 7

In Inventive Example 7, a structure similar to that of the semiconductor laser device according to Inventive Example 1 was employed except that the $SiN_x$ film 12a of the semiconductor laser device according to Inventive Example 1 was replaced with a $TiN_x$ film (x is approximately 1) and the $SiO_y$ film 12b was replaced with a $TiO_y$ film (y is approximately 2).

The $TiN_x$ film and the $TiO_y$ film were formed by plasma CVD with source materials of $TiCl_4$, $NH_3$ and $N_2O$. The $TiN_x$ film was formed with a substrate temperature of 450° C., a high-frequency output of 100 W. a $TiCl_4$ flow rate of 30 SCCM and an $NH_3$ flow rate of 300 SCCM. The $TiO_y$ film was formed with an $TiCl_4$ flow rate of 30 SCCM, an $N_2O$ flow rate of 400 SCCM, high-frequency output of 100 W and a substrate temperature of 450° C. The $TiN_x$ film and the $TiO_y$ film were continuously formed in the same apparatus.

In the semiconductor laser device according to Inventive Example 7, the mean operating current of 10 lots with an output power of 5 mW was 75 mA, and the yield was 83%.

Inventive Example 8

In Inventive Example 8, a three-layer dielectric film formed by a $TiN_x$ film (x is approximately 1), a $TiN_{x1}O_{y1}$ film (x1 is approximately 0.5 and y1 is approximately 1) and a $TiO_y$ film (y is approximately 2) in place of the $SiN_x$ film 112a, the $SiN_{x1}O_{y1}$ film 112b and the $SiO_y$ film 112c of the dielectric film 12B was employed in the semiconductor laser device shown in FIG. 3.

In the semiconductor laser device according to Inventive Example 8, the mean operating current of 10 lots with an output power of 5 mW was 73 mA, and the yield was 88%.

Inventive Example 9

In Inventive Example 9, three layers of a $TiN_x$ film (x is approximately 1), a $TiN_{x2}O_{y2}$ film, i.e., an oxynitride film having a graded composition, and a $TiO_y$ film (y is approximately 2) were employed in place of the $SiN_x$ film 112a, the $SiN_{x2}O_{y2}$ film 112d and the $SiO_y$ film 112c of the dielectric film 12C in the semiconductor laser device shown in FIG. 4.

The $TiN_{x2}O_{y2}$ film was formed by gradually reducing the content x2 of N (nitrogen) from 1 to zero and gradually increasing the content y2 of O (oxygen) from zero to 2 from the interface between the same and the $TiN_x$ film.

In the semiconductor laser device according to Inventive Example 9, the mean operating current of 10 lots with an output power of 5 mW was 70 mA, and the yield was 89%.

Inventive Example 10

In Inventive Example 10, a semiconductor laser device was prepared by removing the $TiN_x$ film from the semiconductor laser device according to Inventive Example 9.

In the semiconductor laser device according to Inventive Example 10, the mean operating current of 10 lots with an output power of 5 mW was 71 mA, and the yield was 88%.

Comparative Example 1

In comparative example 1, a dielectric film of $SiO_y$ (y is approximately 2) having a thickness of 500 nm was employed in place of the dielectric film 12A in the structure of the semiconductor laser device shown in FIG. 1.

In the semiconductor laser device according to comparative example 1, the mean operating current of 10 lots with an output power of 5 mW was 82 mA, and the yield was 57%.

Comparative Example 2

In comparative example 2, a dielectric film of $SiN_x$ (x is approximately 1) was employed in place of the dielectric film 12A in the structure of the semiconductor laser device shown in FIG. 1. The thickness of this dielectric film was 500 nm.

In the semiconductor laser device according to comparative example 2, the mean operating current of 10 lots with an output power of 5 mW was 80 mA, and the yield was 60%.

Table 2 shows the aforementioned results.

TABLE 2

| Dielectric Film | | Operating Current (Mean Value) | Yield |
|---|---|---|---|
| Inventive Example 1 | $SiN_x$ Film 12a/$SiO_y$ Film 12b | 72 mA | 85% |
| Inventive Example 2 | $SiN_x$ Film 112a/ $SiN_{x1}O_{y1}$ Film 112b/ $SiO_y$ Film 112c | 72 mA | 87% |
| Inventive Example 3 | $SiN_x$ Film 112a/ $SiN_{x2}O_{y2}$ Film 112d/ $SiO_y$ Film 112c | 69 mA | 90% |
| Inventive Example 4 | $SiN_{x2}O_{y2}$ Film 112d/ $SiO_y$ Film 112c | 70 mA | 88% |
| Inventive Example 5 | $SiN_{x2}O_{y2}$ Film 112d/ $SiO_y$ Film 112c | 70 mA | 87% |
| Inventive Example 6 | Inventive Examples 1–5 (Irregularities on Ridge Portion | Reduced by about 5% | Improved by 2–3% |
| Inventive Example 7 | $TiN_x$ Film/$TiO_y$ Film | 75 mA | 83% |
| Inventive Example 8 | $TiN_x$ Film/$TiN_{x1}O_{y1}$ Film/$TiO_y$ Film | 73 mA | 88% |
| Inventive Example 9 | $TiN_x$ Film/$TiN_{x2}O_{y2}$ Film/$TiO_y$ Film | 70 mA | 89% |
| Inventive Example 10 | $TiN_{x2}O_{y2}$ Film/$TiO_y$ Film | 71 mA | 88% |
| Comparative Example 1 | $SiO_y$ | 82 mA | 57% |
| Comparative Example 2 | $SiN_x$ | 80 mA | 60% |

As shown in Table 2, the mean operating currents, 82 mA and 80 mA in comparative examples 1 and 2 respectively, were reduced to 69 to 75 mA in Inventive Examples 1 to 5 and 7 to 10. In comparative examples 1 and 2, the dielectric films were considerably separated and cracked, to increase the number of defectives. Such defectives were particularly remarkable in comparative example 1. Further, good items of comparative examples 1 and 2 included a number of devices exhibiting small cracks on the dielectric films. In comparative examples 1 and 2, the operating currents were conceivably increased due to unavailable currents flowing through such cracks. The yields, 57% and 60% in comparative examples 1 and 2 respectively, were improved to 83 to 90% in Inventive Examples 1 to 5 and 7 to 10.

While the $SiN_{x2}O_{y2}$ film 112d was formed by plasma CVD at the substrate temperature of 300° C. in Inventive Example 3, an $SiN_{x2}O_{y2}$ film 112d having a graded composition of nitrogen and oxygen may alternatively be formed around the interface between the $SiN_x$ film 112a and the $SiO_y$ film 112c by directly forming the $SiO_y$ film 112c on the $SiN_x$ film 112a and thereafter performing heat treatment at 500 to 1000° C., for example, thereby mutually diffusing nitrogen (N) contained in the $SiN_x$ film 112a and oxygen (O) contained in the $SiO_y$ film 112c.

Alternatively, the film forming temperature (substrate temperature) for the $SiO_y$ film 112c may be set to 500 to 1000° C. by thermal CVD, for example, when directly forming the $SiO_y$ film 112c on the $SiN_x$ film 112a, thereby mutually diffusing nitrogen (N) contained in the $SiN_x$ film 112a and oxygen (O) contained in the $SiO_y$ film 112c during formation of the $SiO_y$ film 112c and forming the $SiN_{x2}O_{y2}$ film 112d having a graded composition of nitrogen and oxygen around the interface between the $SiN_x$ film 112a and the $SiO_y$ film 112c.

Thus, when forming the $SiN_{x2}O_{y2}$ film 112d by diffusion, the thickness thereof can be controlled to 5 nm to 50 nm through the conditions of the annealing temperature and the time.

While the $SiN_{x2}O_{y2}$ film 112d was formed by plasma CVD at the substrate temperature of 300° C. in Inventive Example 4, an $SiN_{x2}O_{y2}$ film 112d having a graded composition of nitrogen and oxygen may alternatively be formed around the interface between the nitride-based semiconductor layers 4 to 9 and the $SiO_y$ film 112c by directly forming the $SiO_y$ film 112c on the nitride-based semiconductor layers 4 to 9 and thereafter performing heat treatment at 500 to 1000° C., for example, thereby mutually diffusing nitrogen (N) contained in the nitride-based semiconductor layers 4 to 9 and oxygen (O) contained in the $SiO_y$ film 112c similarly to the above. Performing heat treatment at 1000° C. for 30 minutes corresponds to the Inventive Example 5.

Alternatively, the film forming temperature (substrate temperature) for the $SiO_y$ film 112c may be set to 500 to 1000° C. by thermal CVD, for example, when directly forming the $SiO_y$ film 112c on the nitride-based semiconductor layers 4 to 9, thereby mutually diffusing nitrogen (N) contained in the nitride-based semiconductor layers 4 to 9 and oxygen (O) contained in the $SiO_y$ film 112c during formation of the $SiO_y$ film 112c thereby forming the $SiN_{x2}O_{y2}$ film 112d having a graded composition of nitrogen and oxygen around the interface between the nitride-based semiconductor layers 4 to 9 and the $SiO_y$ film 112c.

Thus, when forming the $SiN_{x2}O_{y2}$ film 112d by diffusion, the thickness thereof can be controlled to 5 nm to 50 nm through the conditions of the annealing temperature and the time.

While the substrate is prepared from the sapphire substrate having a C plane in each of the aforementioned embodiments, another plane orientation of the sapphire substrate such as an r plane or an m plane may alternatively be employed. Further alternatively, the substrate may be prepared from SiC or GaN.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light emitting device comprising:
   a nitride-based semiconductor layer including an emission layer; and
   a dielectric film formed on the surface of said nitride-based semiconductor layer, wherein
   said dielectric film contains a nitride on the side of the interface between said dielectric film and said nitride-based semiconductor layer while containing an oxide on the side opposite to said nitride-based semiconductor layer, and further wherein said dielectric film successively includes a nitride film and an oxide film as said nitride and said oxide; wherein
   said dielectric film further includes a compound film containing nitrogen and oxygen between said nitride film and said oxide film.

2. The semiconductor light emitting device according to claim 1, wherein
   said compound film has such a graded composition that the content of nitrogen gradually reduces and the content of oxygen gradually increases from the side of the interface between said compound film and said nitride film toward the side of the interface between said compound film and said oxide film.

3. The semiconductor light emitting device according to claim 1 wherein
   said nitride film is a silicon nitride film or a titanium nitride film, and said oxide film is a silicon oxide film or a titanium oxide film.

4. A semiconductor light emitting device comprising:
   a nitride-based semiconductor layer including an emission layer; and
   a dielectric film formed on the surface of said nitride-based semiconductor layer, wherein
   said dielectric film contains a nitride on the side of the interface between said dielectric film and said nitride-based semiconductor layer while containing an oxide on the side opposite to said nitride-based semiconductor layer; wherein
   said dielectric film includes a compound film containing nitrogen and oxygen as said nitride and said oxide, and said compound film has such a graded composition that the content of nitrogen gradually reduces and the content of oxygen gradually increases from the side of the interface between said compound film and said nitride-based semiconductor layer toward the opposite side.

5. The semiconductor light emitting device according to claim 4, wherein said compound film is a compound film containing silicon or titanium and containing nitrogen and oxygen.

6. A semiconductor light emitting device comprising:
   a nitride-based semiconductor layer including an emission layer; and
   a dielectric film formed on the surface of said nitride-based semiconductor layer, wherein
   said dielectric film contains a compound containing nitrogen and oxygen on the side of the interface between said dielectric film and said nitride-based semiconductor layer while containing an oxide on the side opposite to said nitride-based semiconductor layer.

7. The semiconductor light emitting device according to claim 6, wherein
   said dielectric film includes a compound film as said compound and includes an oxide film as said oxide, while said compound film has such a graded composition that the content of nitrogen gradually reduces and the content of oxygen gradually increases from the side of the interface between said compound film and said nitride-based semiconductor layer toward the opposite side.

8. The semiconductor-light emitting device according to claim 7, wherein
   said compound film is a compound film containing silicon or titanium and containing nitrogen and oxygen, and said oxide film is a silicon oxide film or a titanium oxide film.

9. A semiconductor light emitting device comprising:
   a nitride-based semiconductor layer including an emission layer; and
   a dielectric film formed on the surface of said nitride-based semiconductor layer, wherein
   said dielectric film contains a nitride on the side of the interface between said dielectric film and said nitride-based semiconductor layer while containing a compound containing nitrogen and oxygen on the side opposite to said nitride-based semiconductor layer.

10. The semiconductor light emitting device according to claim 9, wherein
    said dielectric film includes a nitride film as said nitride and includes a compound film as said compound, and said compound film has such a graded composition that the content of nitrogen gradually reduces and the content of oxygen gradually increases from the side of the interface between said compound film and said nitride film toward the opposite side.

11. The semiconductor light emitting device according to claim 10, wherein said nitride film is a silicon nitride film or a titanium nitride film, and said compound film is a compound film containing silicon or titanium and containing nitrogen and oxygen.

12. A semiconductor light emitting device comprising:
a nitride-based semiconductor layer including an emission layer; and
a dielectric film formed on the surface of said nitride-based semiconductor layer, wherein
said dielectric film contains a nitride on the side of the interface between said dielectric film and said nitride-based semiconductor layer while containing an oxide on the side opposite to said nitride-based semiconductor layer; wherein
said nitride-based semiconductor layer further includes a cladding layer formed on said emission layer, said cladding layer has a flat portion and a ridge portion located on said flat portion, and said dielectric film is formed on said flat portion of said cladding layer and the side surface of said ridge portion.

13. The semiconductor light emitting device according to claim 12, wherein
the side surface of said ridge portion is irregularized, and said dielectric film is formed on said flat portion of said cladding layer and the side surface of said ridge portion.

14. A semiconductor light emitting device comprising:
a nitride-based semiconductor layer including an emission layer; and
a dielectric film formed on the surface of said nitride-based semiconductor layer, wherein
said dielectric film contains a nitride on the side of the interface between said dielectric film and said nitride-based semiconductor layer while containing an oxide on the side opposite to said nitride-based semiconductor layer; wherein
said nitride-based semiconductor layer further includes a first conductivity type semiconductor layer provided under said emission layer and a second conductivity type semiconductor layer provided on said emission layer, a partial region of said nitride-based semiconductor layer is removed to partially expose said first conductivity type semiconductor layer, a first electrode is formed on said exposed region of said first conductivity type semiconductor layer, a second electrode is formed on said second conductivity type semiconductor layer, and said dielectric film is formed on the surface of said nitride-based semiconductor layer between said first electrode and said second electrode.

15. A semiconductor light emitting device comprising:
an emission layer composed of a nitride-based semiconductor;
a cladding layer formed on said emission layer and composed of a nitride-based semiconductor having a flat portion and a ridge portion located on said flat portion; the side surface of said ridge portion of said cladding layer being irregularized, and
a dielectric film formed on said flat portion of said cladding layer and the side surface of said ridge portion.

16. The semiconductor light emitting device according to claim 15, wherein said dielectric film contains a nitride on the side of the interface between said dielectric film and said nitride-based semiconductor layer while containing an oxide on the side opposite to said nitride-based semiconductor layer.

17. The semiconductor light emitting device according to claim 15, wherein said dielectric film contains a compound containing nitrogen and oxygen on the side of the interface between said dielectric film and said nitride-based semiconductor layer while containing an oxide on the side opposite to said nitride-based semiconductor layer.

18. The semiconductor light emitting device according to claim 15, wherein
said dielectric film contains a nitride on the side of the interface between said dielectric film and said nitride-based semiconductor layer while containing a compound containing nitrogen and oxygen on the side opposite to said nitride-based semiconductor layer.

* * * * *